United States Patent [19]

Hammerl et al.

[11] Patent Number: 5,717,628
[45] Date of Patent: Feb. 10, 1998

[54] NITRIDE CAP FORMATION IN A DRAM TRENCH CAPACITOR

[75] Inventors: Erwin Hammerl, Stormville; Herb Lei Ho, Washingtonville, both of N.Y.

[73] Assignees: Siemens Aktiengesellschaft, Munich, Germany; International Business Machines Corporation, Armonk, N.Y.

[21] Appl. No.: 606,469

[22] Filed: Mar. 4, 1996

[51] Int. Cl.$^6$ .......................... H01L 21/76; H01L 27/115
[52] U.S. Cl. .......................... 365/149; 257/301; 257/300; 257/304
[58] Field of Search .................. 365/149; 257/302, 257/306; 437/43, 60, 52

[56] References Cited

U.S. PATENT DOCUMENTS

| | | | |
|---|---|---|---|
| 4,688,063 | 8/1987 | Lu et al. | 357/23.6 |
| 4,922,313 | 5/1990 | Tsuchiya | 357/23.6 |
| 4,956,692 | 9/1990 | Ozaki et al. | 357/49 |
| 5,273,928 | 12/1993 | Tani | 437/52 |
| 5,281,548 | 1/1994 | Prall | 437/43 |
| 5,369,049 | 11/1994 | Acocella et al. | 437/52 |
| 5,406,515 | 4/1995 | Rajeevakumar | 365/182 |
| 5,502,320 | 3/1996 | Yamada | 257/302 |
| 5,504,357 | 4/1996 | Kim et al. | 257/306 |
| 5,521,115 | 5/1996 | Park et al. | 437/60 |

FOREIGN PATENT DOCUMENTS 5-335512  12/1993  Japan.

*Primary Examiner*—Viet Q. Nguyen
*Attorney, Agent, or Firm*—Donald B. Paschburg

[57] ABSTRACT

A method for forming an oxygen-impervious barrier on the oxide collar of a trench capacitor in a DRAM cell. The process consists of etching a shallow trench into the oxide collar which surrounds the polysilicon trench fill and isolating it from the single crystal semiconducting substrate material of the DRAM cell to a depth which is at least equal to or larger than the width of the oxide collar. A nitride layer with a thickness equal to or thicker than half of the width of the oxide collar is then deposited on the top surface of the freshly excavated oxide collar such that the aforementioned trench is completely filled with this nitride layer, and the entire surfaces of the substrate and polysilicon trench fill are completely covered. The newly formed nitride layer is then selectively overetched in order to completely remove it from the substrate and polysilicon trench fill surfaces, while still maintaining a sufficient thickness of this layer disposed on the oxide collar sufficient to prevent oxygen diffusion into the oxide collar. Alternatively, the nitride layer may be deposited as a thin layer sandwiched between the original oxide collar and an additional thermally deposited oxide layer.

6 Claims, 5 Drawing Sheets

NITRIDE CAP FORMATION IN A DRAM TRENCH CAPACITOR

BACKGROUND OF THE INVENTION

1. Field of the Invention

The field of the present invention relates generally to dynamic random access memories (DRAMs), and more specifically to a process for making a nitride cap on the oxide collar in a DRAM cell.

2. Description of the Prior Art

Dynamic random-access memory (DRAM) cells are composed of two main components, a storage capacitor (which stores charge) and an access transistor (which transfers charge to and from the capacitor). The communication between the storage capacitor and the access transistor is controlled by a select signal (commonly referred to as a word line) which connects one plate of the capacitor to a data line (commonly referred to as the bit line). The storage capacitor is typically located in a deep trench which is etched into a semiconductor substrate. This trench design has become the standard in DRAM processing, since it enables a greater amount of charge to be stored in a small area without taking up chip surface area.

Conventional DRAM arrays are organized so that multiple storage cells are positioned as close as possible to one another. During the operation of the array, individual storage cells are selected by the energizing of the word line, each of the selected cells communicating their contents to sense amplifiers by way of the associated bit lines. In order for the DRAM array to function properly, it is essential to isolate one transistor from a neighboring transistor, and each individual transistor from other active components. Since current research is directed toward a greater density of storage cells per unit area of semiconductor substrate, effective isolation means becomes all the more important.

Current technology provides for the isolation of individual transistors in the form of a trench isolation region wherein a vertical area is etched into the electrically active silicon substrate and filled with oxide. This area is generally referred to in the art as the shallow trench isolation (STI). In trench capacitor DRAM technology, the isolation of individual transistor components from other active areas, on the other hand, is accomplished by an oxide collar. This oxide collar surrounds the upper part of each individual trench, preventing vertical parasitic leakage between the buried plate and the connection of the inner trench electrode to the transfer device. There are a number ways in which this isolation may be accomplished, all commonly using insulating layers of $SiO_2$ or some other inert material as the collar. The thickness of this collar can be varied, and is typically designed so as to effectively prevent voltage on an interconnection line above the insulator from inverting the silicon beneath the insulator and thereby creating a parasitic channel.

A major problem that exists in conventional trench capacitors, which allows for vertical parasitic leakage between the buried plate and the connection of the inner trench electrode, is oxidation induced stress that is built up in the oxide collar during the fabrication processes of the DRAM. During these oxidation steps, oxygen can diffuse from the surface of the silicon substrate into and along the oxide collar. The neighboring silicon substrate and the trench polysilicon fill can therefore become oxidized. This oxidation leads to a tapered expansion of the collar oxide, which, in turn, leads to a high stress level in the silicon substrate and to the generation of extended crystal defects in the silicon substrate. The defects manifest themselves as dislocations or stacking faults, and are especially prevalent around the most expanded part of the oxide collar. The resulting stress in the silicon substrate, coupled with the extended crystal defects, can cause electrical leakage across the junctions of the associated transistor.

A schematic drawing of a 256 Mb trench DRAM cell equipped with a conventional oxide collar is depicted in FIG. 1. The structure consists of a trench capacitor 10 which is etched into a single crystal P type doped silicon substrate 16. The lower level of the trench 12 is typically filled with an N+ doped polysilicon material which is isolated from the buried N-well by an insulating node dielectric barrier 14. The storage node 24 of the capacitor in the trench is typically formed from highly doped N+ polysilicon and is connected to the DRAM's word line 20 by a self-aligned buried strap 22. The DRAM also has a shallow trench isolation (STI) region 28 which isolates this cell from adjacent cells. The DRAM cell includes a bit line 17 which runs horizontally connecting the cell's bit line contact 19 to other cells' bit line contacts. One of the DRAM's word lines forms the pass gate 13 to an adjacent cell. A second array word line 15 runs vertically, passing over the trench capacitor 10 and partially over a shallow trench isolation (STI) region 28, forming pass gates for other adjacent cells.

As can be inferred from FIG. 1 which shows a prior art 256 Mb DRAM cell, stress in the region 23 between the oxide collar 18 and the highly doped single crystal substrate material 16 can cause the region to be susceptible to parasitic leakage. In order to prevent this leakage, it is first desirable to cure the underlying cause that produces it, namely, to block the oxygen diffusion into the oxide collar. A possible solution which would substantially prevent this problem would be to isolate the trench by covering it with a cap or mask that is impervious to oxygen (such as a nitride liner). Such an electrically inert liner could act as a diffusion barrier for oxygen and would therefore block the diffusion path into the oxide collar without adversely affecting the performance of the DRAM.

Attempts have been made in the prior art to address this need for masks or liners that prevent oxygen diffusion from the substrate surface into the underlying trench structure. For example, U.S. Pat. No. 4,922,313 entitled "PROCESS FOR MANUFACTURING SEMICONDUCTOR MEMORY DEVICE AND PRODUCT FORMED THEREBY" issued to O. Tsuchiya and assigned to Hitachi, Ltd., describes DRAM structure in which a silicon nitride layer is used as an oxidation mask for local oxidation along the deep trench capacitor sidewall. The intention of this particular nitride mask, however, is to define an area of electrical connection between the polysilicon trench fill and the substrate. The mask is completely removed in subsequent processing steps.

Another invention that utilizes a silicon nitride liner in a deep trench DRAM structure is disclosed in U.S. Pat. No. 5,406,515 entitled "METHOD FOR FABRICATING LOW LEAKAGE SUBSTRATE PLATE TRENCH DRAM CELLS AND DEVICES FORMED THEREBY" issued to T. V. Rajeevakumar and assigned to the International Business Machines Corporation. The invention describes a low leakage DRAM cell in which a silicon nitride masking layer is used as a diffusion mask for dopant out diffusion into vertical parts of the deep trench. The silicon nitride liner in this invention is deposited vertically along the deep trench and does not function to reduce oxidation-induced stress during the processing of the device.

While these and other masking liners have been used as diffusion barriers in DRAM devices, there are still several major disadvantages associated with prior art technology. If, for example, the nitride liner is deposited too thin, it is permeable to diffusing oxygen and therefore does not act as an effective barrier. If, on the other hand, the nitride liner is deposited too thick, subsequent etching steps (that occur, for example, during the pad nitride strip) severely damage the liner exposing gaps in the liner. Such gaps are detrimental in further etching steps, allowing the etchants to attack the underlying oxide structure resulting in an unacceptably large void in the oxide fill of the shallow trench isolation region. Still another disadvantage to prior art nitride liners is that electrical charge trapped in the SiN liner or at the interface to the neighboring oxide layers can lead to parasitic leakage along the surface of the shallow trench isolation.

It is, therefore, an object of the present invention to provide an improved method for blocking oxygen diffusion into the oxide collar of a DRAM cell which overcomes the problems associated with prior art techniques.

SUMMARY OF THE INVENTION

A method for forming an oxygen-impervious barrier on the oxide collar of a trench capacitor in a DRAM cell. The process consists of etching a shallow trench into the oxide collar which surrounds the polysilicon trench fill and isolating it from the single crystal semiconducting substrate material of the DRAM cell to a depth which is at least equal to or larger than the width of the oxide collar. A nitride layer with a thickness equal to or thicker than half of the width of the oxide collar is then deposited on the top surface of the freshly excavated oxide collar such that the aforementioned trench is completely filled with this nitride layer, and the entire surfaces of the substrate and polysilicon trench fill are completely covered. The newly formed nitride layer is then selectively overetched in order to completely remove it from the substrate and polysilicon trench fill surfaces, while still maintaining a sufficient thickness of this layer disposed on the oxide collar sufficient to prevent oxygen diffusion into the oxide collar. Alternatively, the nitride layer may be deposited as a thin layer sandwiched between the original oxide collar and an additional thermally deposited oxide layer.

BRIEF DESCRIPTION OF THE DRAWINGS

In order to better understand the present invention, reference should be made to the following detailed description taken in conjunction with the accompanying drawings wherein.

DETAILED DESCRIPTION OF THE INVENTION

The present invention provides an improved method for forming an oxygen diffusion barrier on top of the oxide collar in a standard DRAM trench capacitor. This oxygen diffusion barrier operates to impede the flow of oxygen from the surface of the single crystal silicon substrate during the normal processing of the DRAM cell, thus preventing the oxidation of the underlying substrate material and the polysilicon fill material present in the trench. Such a barrier is especially useful since this oxidation can severely damage the storage device by allowing vertical parasitic leakage to occur between the buried plate and the connection of the inner trench electrode. The processing steps involved in forming such a barrier according to a first embodiment of the present invention are depicted in FIGS. 2A–2F.

Figure 1:
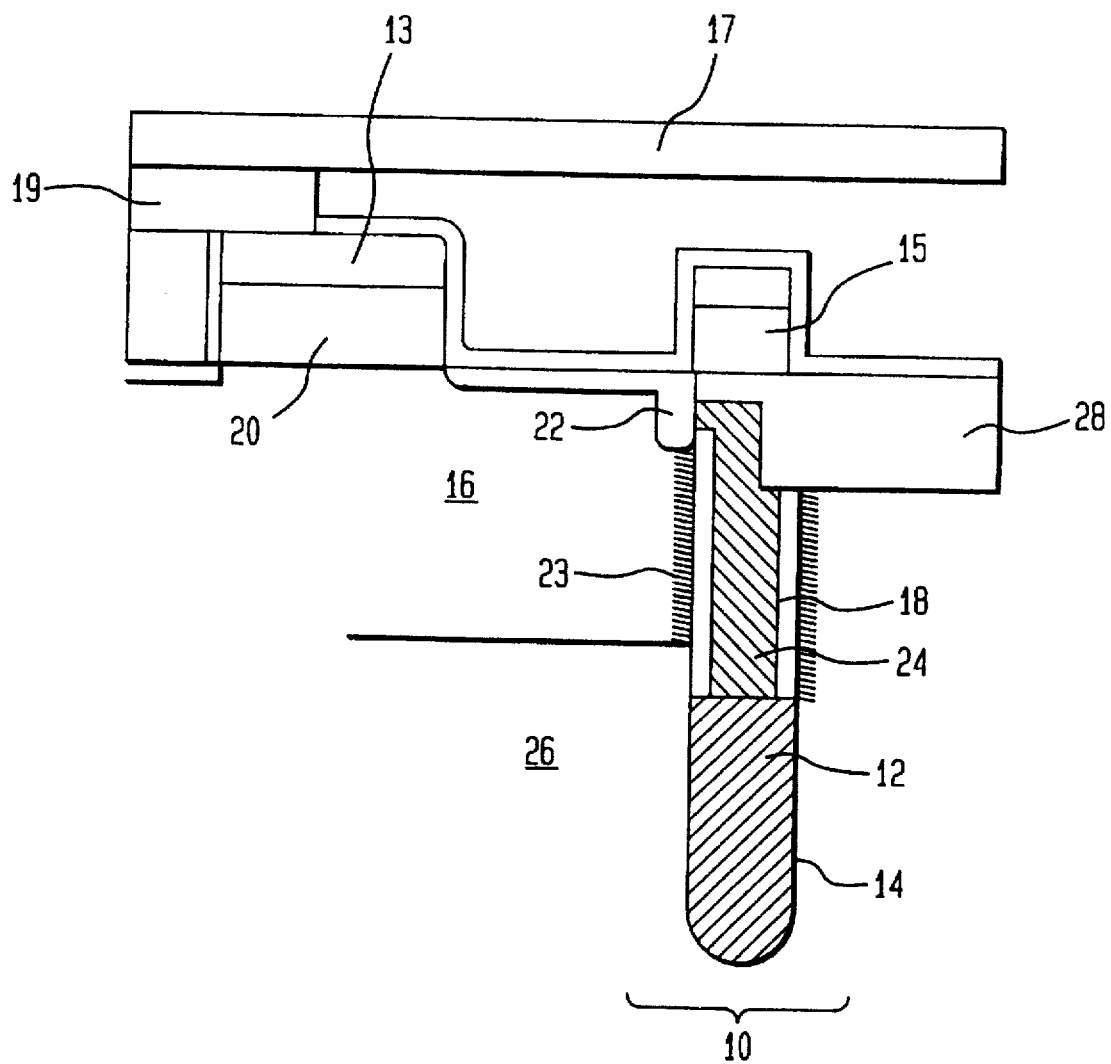
FIG. 1 depicts a cross-sectional side view through a conventional 256 Mb trench DRAM cell with an uncapped oxide collar made in accordance with prior art techniques.
Figure 2A:
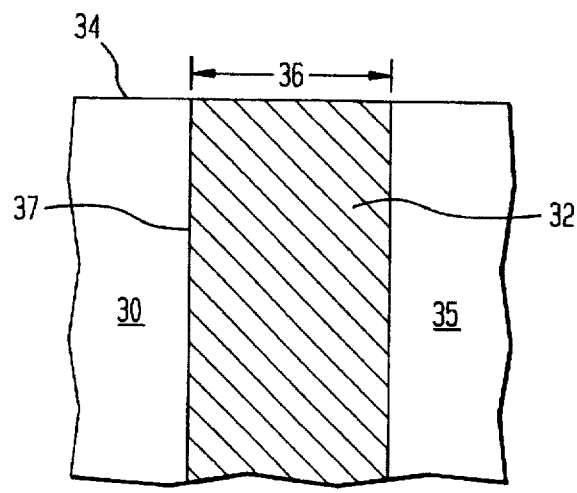
FIGS. 2A–2F depict cross-sectional views illustrating various processing steps of fabricating an improved nitride cap on an oxide collar of a DRAM cell according to a first embodiment of the present invention.

Referring to FIG. 2A, there is shown a schematic cross-sectional view of a deep trench oxide collar 32 in a standard 256 Mb DRAM cell (or BEST cell as it may be otherwise referred to in the art). The oxide collar 32 has been formed by a chemical vapor deposition (CVD) step in accordance with well known techniques familiar to those skilled in the art of DRAM processing. The oxide collar separates the DRAM's single crystal silicon substrate material 30 from its polysilicon trench fill material 35, and has a width 36 which is determined by a spacer etching technique. The single crystal substrate material 30 is typically P-doped and the polysilicon trench fill material 35 is typically N-doped. According to a preferred embodiment of the present invention, the width 36 of the collar oxide 32 herein is on the order of 40 nm. The collar oxide 32 forms a barrier between the single crystal silicon substrate 30 and the polysilicon trench fill 35 in a DRAM cell, the purpose of which is to prevent dopants present in the deep trench from diffusing into the substrate material (and vise versa). The oxide collar 32 intersects the substrate surface at the bottom 34 or at a sidewall 37 of the etched shallow trench isolation (not shown).

Figure 2B:
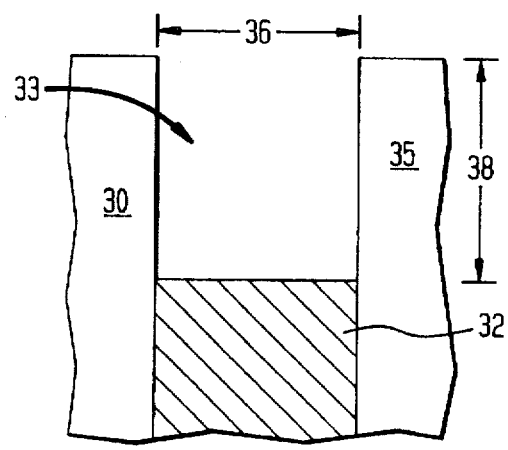

Referring now to FIG. 2B, the next step in the process is depicted. A recess etch step is performed on the oxide collar 32 resulting in a shallow trench 33 having a vertical depth 38. The recess etch step removes only the oxide collar and does not affect the single crystal substrate 30 or the polysilicon trench fill 35. This recess etching process is commonly practiced and familiar to those skilled in this art, and may, for example, be done with a hydrofluoric acid bath. The recess etching step is done such that the collar oxide 32 is removed to a depth 38 that is at least equal to or larger than the width 36 of the collar oxide.

Figure 2C:
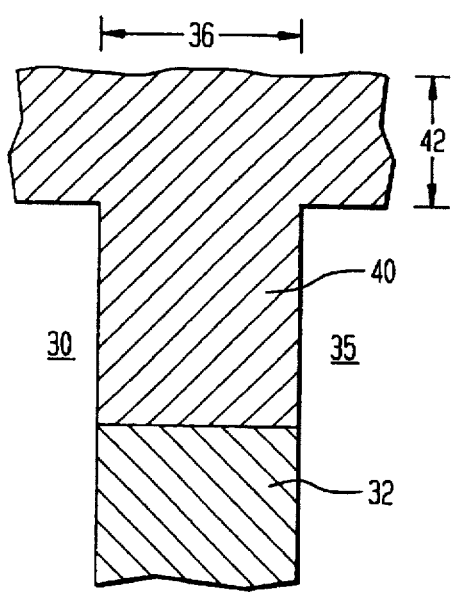
Figure 2D:
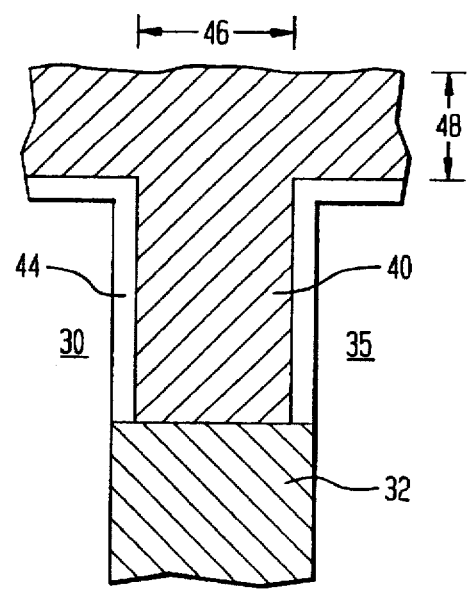

Referring now to FIG. 2C, the next step in the process is depicted. A low pressure chemical vapor deposition (LPCVD) nitride layer 40 is deposited on top of the oxide collar 32 and over the entire surface of the single crystal silicon substrate 30 and the polysilicon trench fill 35, completely filling the shallow trench (33 of FIG. 2B) created by the recess etching step. The LPCVD nitride mask has a surface thickness 42 equal to or thicker than half of the collar oxide width 36, so that complete filling of the previously created shallow trench is ensured. Alternatively, as depicted in FIG. 2D, a thin oxide layer 44 may be grown on the surface of the shallow trench prior to the LPCVD nitride deposition step. This additional step further helps to minimize stress build-up in the single crystal silicon substrate 30 which is not effectively achieved by depositing the nitride layer directly on the substrate. It should be recognized that because of the additional oxide layer 44, the effective width 46 of the oxide collar trench and the thickness 48 of the nitride layer 40 will be slightly less than those depicted in FIG. 2C, but will still be designed such that the LPCVD nitride mask 40 has a thickness 48 that will be substantially thicker than half of the new collar oxide width 46.

Figure 2E:
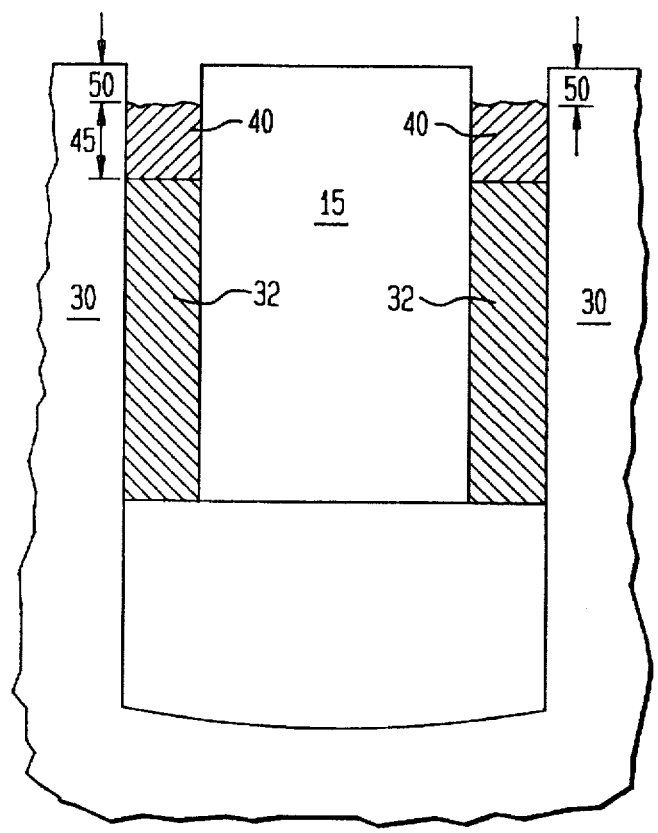
Figure 2F:
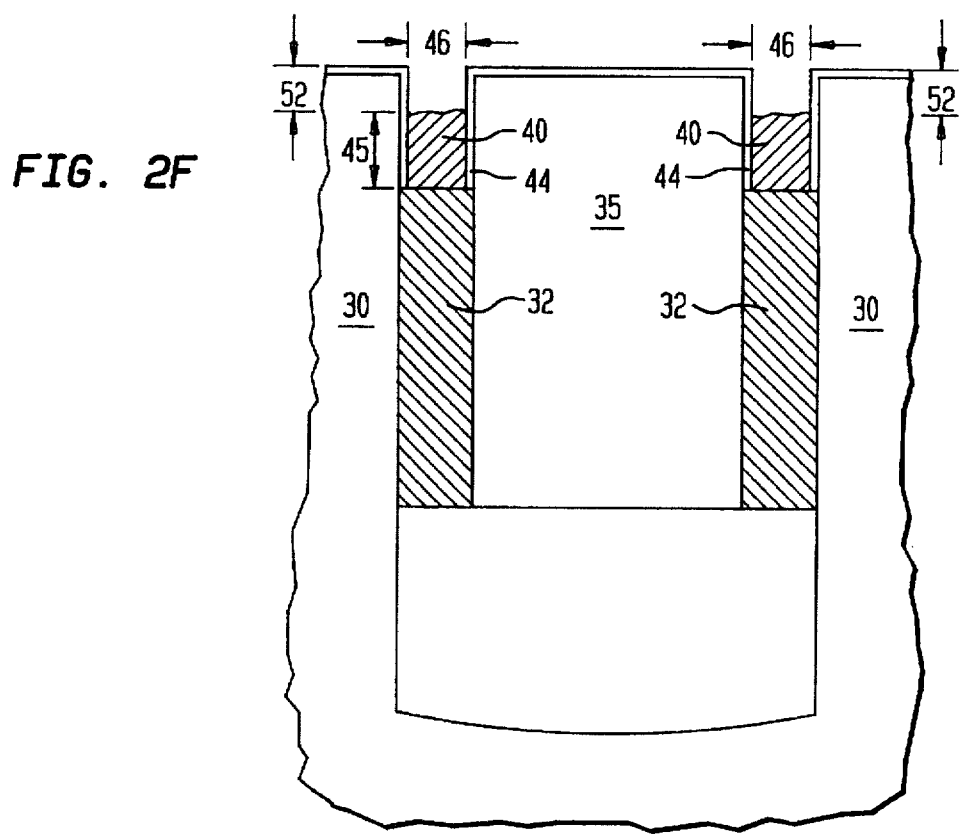

Referring now to FIG. 2E the final step in the nitride cap processing scheme of the first preferred embodiment of the present invention is shown. As depicted therein, an isotropic etch (which, for example, may consist of a hot phosphoric acid etch or chemical downstream etching) has been performed. This etching process, which is commonly referred to by those skilled in the art as "overetching", removes the formerly deposited LPCVD nitride layer 40 without affecting the single crystal silicon substrate 30 or the polysilicon trench fill 35. The depth 50 of this etch and the thickness 45 of the remaining nitride layer 40 are not critical, provided that the etch removes the entire surface LPCVD nitride layer and leaves a sufficient thickness (10–20 nm) of this layer disposed on the oxide collar 32 that will effectively prevent oxygen diffusion from the substrate surface into the oxide collar 32. The results of this overetching process in conjunction with the alternate method of placing an oxide layer over the shallow trench prior to the LPCVD nitride process is depicted in FIG. 2F. The depth 52 of the overetching process that removes some of the LPCVD nitride layer, and the thickness 45 of the remaining nitride layer 40 are similar to those depicted in FIG. 2E, but the width 46 of this nitride mask will be of the same order of magnitude that was required by the processing described in FIG. 2D.

The above-mentioned isotropic overetch steps are required in the case of trench technology where the deep capacitor trench intersects the shallow isolation trench in such a way that vertical sidewalls are formed. The successful use of the isotropic etching step hinges on this arrangement, as the isotropic etching process provides the same etch rate of all oxide surfaces independent of their orientation. It should be understood, however, that the inventive method can also apply to trench capacitors of a planar arrangement. In this case, where the oxide collar along the deep capacitor trench intersects a surface only in a parallel orientation to the wafer substrate (e.g., a planar trench top), an anisotropic reactive ion etch (RIE) could be used for removing the deposited layers.

Figure 3A:
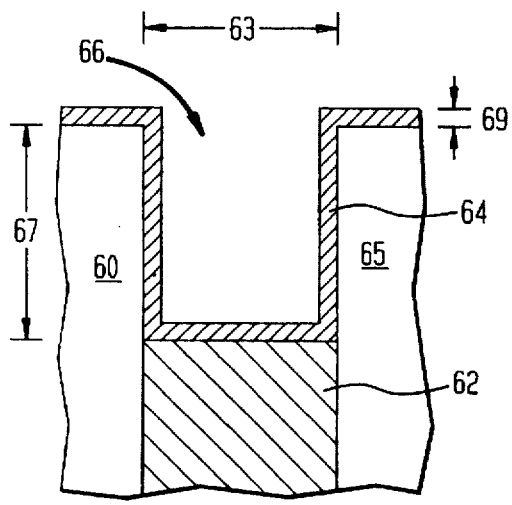
FIGS. 3A–3F depict cross-sectional views illustrating various processing steps of fabricating an improved nitride cap on an oxide collar of a DRAM cell according to a second embodiment of the present invention.

In order to even further minimize any stress build-up by the nitride layer deposition on the oxide collar in the DRAM cell, a second preferred embodiment to the nitride cap process described above will now be described in detail as follows:

Referring to FIG. 3A, there is shown a schematic cross-sectional view of a deep trench oxide collar 62 which has been formed by a chemical vapor deposition (CVD) step in accordance with well known techniques familiar to those skilled in the art of DRAM processing. The oxide collar separates the DRAM's single crystal silicon substrate material 60 (which is typically P-doped) from its polysilicon trench fill material 65 (which is typically N-doped), and has a width 63 which is determined by a spacer etching technique. This width is approximately 40 nm in the presently described invention. A recess etch step has been performed on the oxide collar 62 resulting in a shallow trench 66 having a vertical depth 67. The recess etch step removes only the oxide collar and does not affect the single crystal substrate 60 or the polysilicon trench fill 65. This recess etching process is commonly practiced and familiar to those skilled in this art, and may, for example, be done with a hydrofluoric acid bath. The recess etching step is done such that the collar oxide 62 is removed to a depth 67 that is at least equal to or larger than the width 63 of the collar oxide. Next, a thin nitride layer 64 is deposited by LPCVD. The thin nitride layer completely coats the surface of the single crystal silicon substrate material 60 and the polysilicon trench fill 65, and lines the entire surface of the etched out oxide collar trench. The thickness 69 of this nitride layer is on the order of 5 nm. The 5 nm dimension of the nitride layer 64 is approximately the minimum thickness of the nitride layer that is able to act as a continuous oxygen diffusion barrier.

Figure 3B:
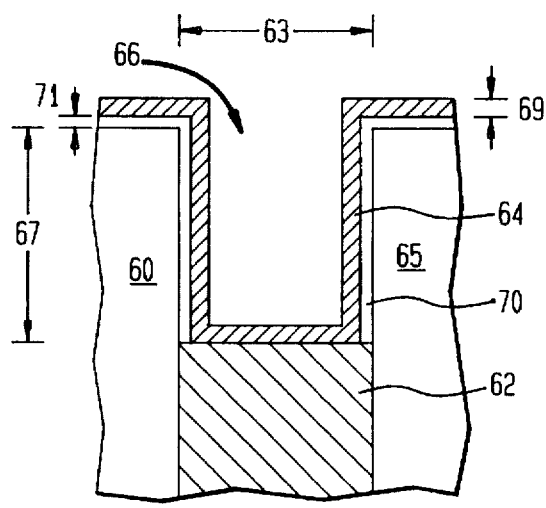

Referring now to FIG. 3B, the oxide collar of the DRAM trench capacitor depicted therein can optionally include a thin thermally-deposited oxide layer 70 sandwiched between the single crystal substrate 60 and the LPCVD nitride layer 64 on the left of the figure, and between the polysilicon trench fill 65 and the LPCVD nitride layer 64 on the right of the figure. This oxide layer 70 may be deposited in any one of a number of commonly practiced techniques familiar to those skilled in the art, and has a thickness 72 which is on the order of a few nanometers. The deposition of this thin oxide coating does not affect the deposition of the LPCVD nitride layer 64 whose thickness 69 remains the same as it did in FIG. 3A. The purpose of this thin oxide coating 70 is to minimize the stress build-up in the silicon substrate 60.

Figure 3C:
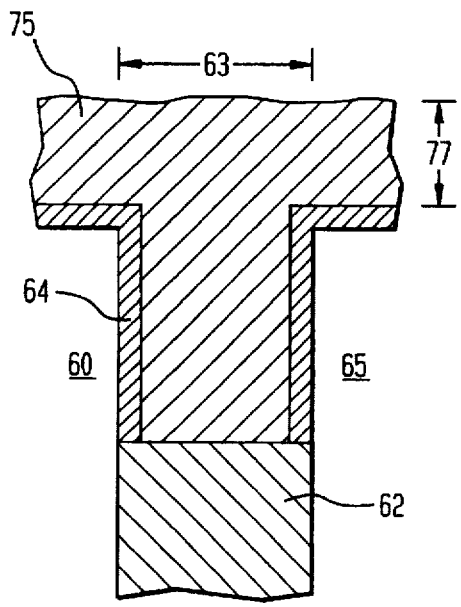
Figure 3D:
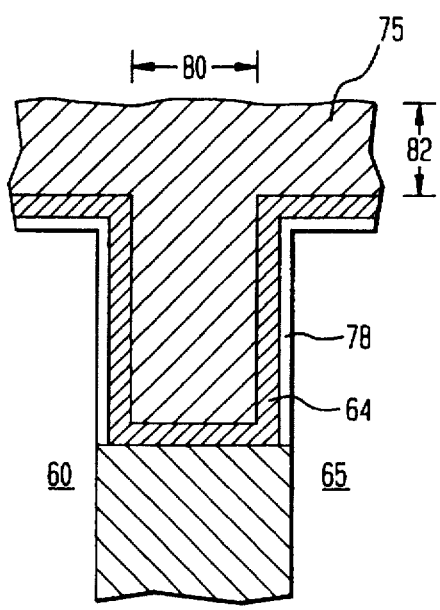

Referring now to FIG. 3C, the next step in the process is depicted. An oxide layer 75 is deposited on top of the LPCVD nitride liner 64 which is itself disposed on the original oxide collar 62. This new oxide layer 75 is deposited over the entire surface of the now LPCVD nitride-covered single crystal silicon substrate 60 and the polysilicon trench fill region 65, completely filling the shallow trench (66 of FIG. 3B) created by the recess etching step. The oxide layer is deposited in any one of a number of commonly practiced techniques familiar to those skilled in the art, and has a thickness 77 which is chosen to be equal to or thicker than half of the collar oxide width 63, so that complete filling of the previously created shallow trench is ensured. If the collar oxide trench is to include an optional oxide layer (like the one shown in FIG. 3B), then it may be grown on the surface of the shallow trench prior to the LPCVD nitride deposition step. This arrangement is depicted in FIG. 3D where the thermally grown oxide layer is designated by the numeral 78. This additional oxide layer deposition step further helps to minimize stress build-up in the single crystal silicon substrate 60 which is not effectively achieved by depositing the nitride layer directly on the substrate. It should be recognized that because of the additional oxide layer 78, the effective width 80 of the oxide collar trench and the thickness 82 of the oxide layer 75 will be slightly less than those depicted in FIG. 3C, but will still be designed such that the oxide layer 75 has a thickness 82 that will be substantially thicker than half of the collar oxide width 80.

Figure 3E:
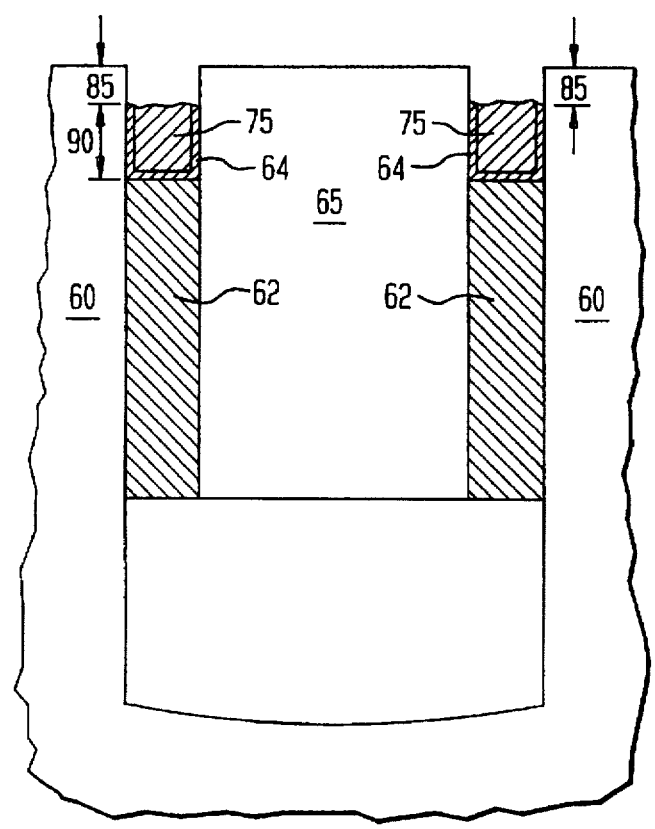
Figure 3F:
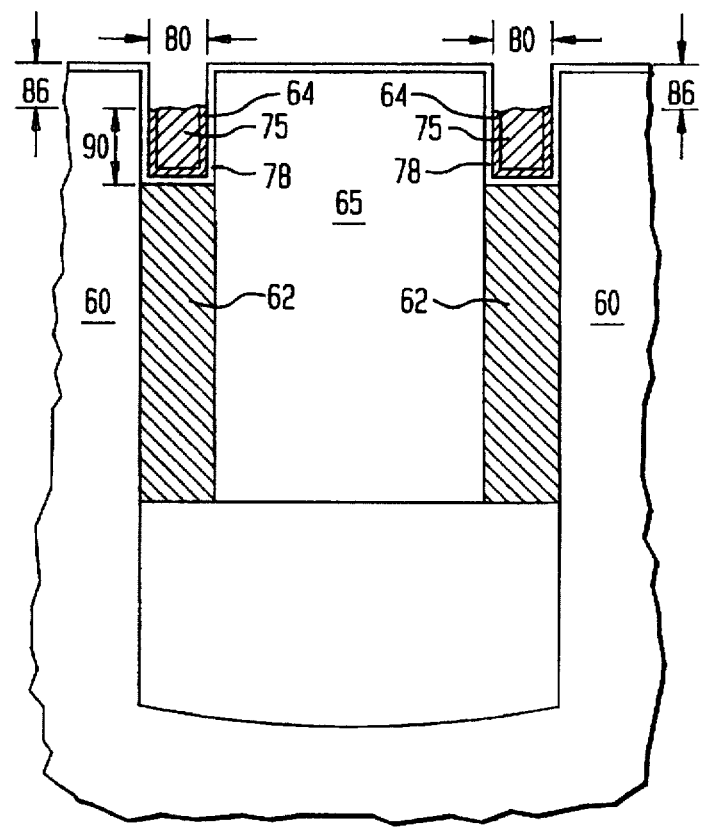

Referring now to FIG. 3E the final step in the nitride cap processing scheme of the second preferred embodiment of the present invention is shown. As depicted therein, an isotropic etch (which, for example, may consist of an etching mixture of hydrofluoric acid and glycerol or a chemical downstream etching process) has been performed. The etching process could also be done in selective acids: first in hydrofluoric acid to remove the deposited oxide collar, and then in phosphoric acid to remove the deposited nitride layer. Either of these etching processes, etches at about the same rate as that used in the LPCVD nitride etch step discussed above. The etches completely remove the formerly deposited oxide layer 75 and LPCVD nitride layer 64 without affecting the single crystal silicon substrate 60 or the polysilicon trench fill 65. The depth 85 of the etch into the oxide collar trench, and the thickness 90 of the remaining oxide/nitride composite layer are not critical, provided that the etch removes the entire surface oxide and LPCVD nitride layers and leaves a sufficient thickness (10–20 nm) of the composite layer above the oxide collar-filled trench that will effectively prevent oxygen diffusion into the oxide collar 62. The results of this overetching process in conjunction with the optional placement of the oxide layer over the shallow trench prior to the LPCVD nitride process, is depicted in FIG. 3F. The depth 86 of the overetching process that removes some of the oxide and LPCVD nitride layers, and the thickness 90 of the remaining composite oxide/ nitride layer are similar to those depicted in FIG. 3E, but the width 80 of this composite mask will be of the same order of magnitude that was required by the processing described in FIG. 3D.

After the oxide collar is sealed with a nitride cap (in accordance with either of the preferred embodiments of the present invention), the normal fabrication processes of the DRAM continue according to well known and established techniques. Any small divots left at the top of the oxide collar by the overetch steps are filled during the filling of the shallow trench isolation region.

As should now be apparent, the present invention substantially overcomes many of the problems associated with prior art DRAM trench capacitors using conventional uncapped oxide collars. The nitride capping layer, whether it be a relatively thick mass or a thin membrane-like layer, when deposited on the oxide collar acts as a diffusion barrier to oxygen and blocks the diffusion path of oxygen into the oxide collar. Because of this improvement, oxidation-induced stress in the neighboring semiconductor substrate and the trench polysilicon fill is dramatically reduced, and vertical parasitic leakage between the buried plate and the connection of the inner trench electrode to the transfer device is substantially prevented.

It should be understood that the embodiments described herein are merely exemplary and that a person skilled in the art may make reasonable variations and modifications to these embodiments utilizing functionally equivalent elements to those described herein. As an example, any type of oxygen diffusion barrier could be used instead of LCPVD nitride. Any and all such variations or modifications, as well as others which may become apparent to those skilled in the art, are intended to be included with the scope and spirit of the invention as defined by the appended claims.

What is claimed is:

1. A DRAM cell of a type including a semiconductor substrate of a first conductivity and a trench formed in said substrate, said trench being filled with a semiconducting material of a second conductivity, a plurality of functional elements formed on and in said semiconductor substrate, and an isolating collar for isolating said functional elements, said isolating collar disposed within said trench and encircling said semiconducting material of said second conductivity; the improvement therewith comprising:
    oxygen barrier means disposed within said trench and on said isolating collar for preventing the diffusion of oxygen from the surface of said substrate into said isolating collar.

2. The DRAM cell according to claim 1, wherein said isolating collar is an oxide collar.

3. The DRAM cell according to claim 2, wherein said oxygen barrier means disposed on said oxide collar comprises a layer of silicon nitride.

4. The DRAM cell according to claim 3, wherein the thickness of said silicon nitride is 10–20 nm.

5. The DRAM cell according to claim 1, wherein the deposition of said oxygen barrier means results in a dramatic reduction in vertical parasitic leakage.

6. The DRAM cell according to claim 1, wherein said improvement further comprises:
    an oxide layer disposed between said isolating collar and said oxygen barrier means, said oxide layer operating to minimize stress build-up in said semiconductor substrate.

* * * * *